United States Patent
Yaghmai et al.

(10) Patent No.: US 7,977,583 B2
(45) Date of Patent: Jul. 12, 2011

(54) SHIELDED CABLE INTERFACE MODULE AND METHOD OF FABRICATION

(75) Inventors: Roya Yaghmai, Los Angeles, CA (US); Frank B. Parrish, Simi Valley, CA (US); Steven Hauptman, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 814 days.

(21) Appl. No.: 11/963,704

(22) Filed: Dec. 21, 2007

(65) Prior Publication Data

US 2009/0151993 A1    Jun. 18, 2009

(51) Int. Cl.
  *H05K 1/11* (2006.01)
(52) U.S. Cl. ........ 174/350; 174/367; 174/377; 174/378; 174/260; 174/261; 174/262; 174/263; 174/264; 361/823; 361/824; 361/825
(58) Field of Classification Search ................... 174/350, 174/367, 377–378, 260–264; 361/823–825
See application file for complete search history.

(56) References Cited

U.S. PATENT DOCUMENTS

| | | | |
|---|---|---|---|
| 4,088,385 A | 5/1978 | Adkins | |
| 5,517,747 A | 5/1996 | Pierro et al. | |
| 5,525,911 A | 6/1996 | Marumo et al. | |
| 5,534,787 A | 7/1996 | Levy | |
| 6,188,297 B1 * | 2/2001 | Akiba | 333/12 |
| 6,239,385 B1 * | 5/2001 | Schwiebert et al. | 174/261 |
| 6,264,476 B1 | 7/2001 | Li et al. | |
| 6,388,198 B1 * | 5/2002 | Bertin et al. | 174/251 |
| 6,420,888 B1 | 7/2002 | Griffin et al. | |
| 6,515,499 B1 | 2/2003 | Parrish et al. | |
| 6,551,126 B1 | 4/2003 | Feldman | |
| 6,686,732 B2 | 2/2004 | Parrish | |
| 6,758,680 B2 | 7/2004 | Duquerroy et al. | |
| 6,864,696 B2 | 3/2005 | Logelin et al. | |
| 7,180,321 B2 | 2/2007 | Behziz et al. | |
| 2001/0040051 A1 * | 11/2001 | Lipponen | 174/262 |
| 2007/0266288 A1 | 11/2007 | Volkerink et al. | |
| 2009/0176406 A1 | 7/2009 | Yaghmai et al. | |
| 2009/0258538 A1 | 10/2009 | Yaghmai et al. | |

* cited by examiner

*Primary Examiner* — Hung S Bui
*Assistant Examiner* — James Wu
(74) *Attorney, Agent, or Firm* — Wolf, Greenfield & Sacks, P.C.

(57) ABSTRACT

A shielded cable interface module having cable receiving grooves extending laterally to an edge of the board, each including a center conductor groove, an insulator groove, and a shield groove. A center conductor via and a shield via extend through the board. A conductor plane on the cable termination side surrounds the cable receiving grooves. The conductor plane includes a non-conductor region within the conductor plane adjacent to each of the conductor center conductor grooves. Ground vias associated with the cable receiving grooves are spaced apart from and partially surround the center conductor via outside and adjacent to the non-conductor region, the ground vias extend through the printed circuit board from the cable termination side to the system interface side.

32 Claims, 10 Drawing Sheets

SHIELDED CABLE INTERFACE MODULE AND METHOD OF FABRICATION

RELATED PATENT APPLICATIONS

The present application is related to U.S. Provisional Patent Application Ser. No. 61/013,631, filed Dec. 13, 2007, entitled COAX CABLE TO PRINTED CIRCUIT BOARD INTERFACE MODULE, by Roya Yaghmai, Frank B. Parrish, and Daniel DeLessert, incorporated herein by reference in its entirety.

BACKGROUND

Sophisticated electronic assemblies often employ dense arrays of electrical conductors to deliver signals from one area to another. Routing large groups of conductors in an efficient and organized manner often proves problematic for a variety of reasons. The overall assembly cost, form factor (size), conductor pitch, and complexity all typically must be taken into account to determine a suitable routing method.

For high performance semiconductor testers, sometimes referred to as automated test equipment or ATE, tester signals up to several gigahertz are funneled and delivered from relatively large circuit boards known as channel cards or instrument boards, to the leads of a very compact device under test or DUT. Often, several thousand signal paths provide the signal delivery scheme between the DUT and the tester electronics. In order to preserve fidelity for such high-frequency signals, the signal paths are constructed to provide a closely matched impedance (normally fifty ohms). Providing a closely matched impedance with a large number of signal paths is difficult.

Further, in the past, connectors such as a SMA coaxial connectors (Subminiature A originally designed by Bendix Scintilla Corporation and commonly produced by companies such as Tyco Electronics Corporation, Berwyn, Pa.) are connected between each cable and the large circuit boards. The mechanical coaxial connectors are expensive and require individual assembly by a skilled technician.

What is needed is a coaxial cable to PCB attachment means that is capable of delivering high frequency, high fidelity signals at low cost. Further, what is needed are methods of fabrication and assembly of coaxial cable to PCB attachment means that are capable of providing higher signal density with higher frequency and high fidelity at low cost.

SUMMARY

In one embodiment, a shielded cable interface module is provided having cable receiving grooves in a cable termination side of a printed circuit board, the cable receiving grooves extending laterally to an edge of the printed circuit board. A cable receiving groove has a center conductor groove, an insulator groove, and a shield groove. A center conductor via extends through the printed circuit board from the center conductor groove to the system interface side. A shield via extends through the printed circuit board from the shield conductor groove to the system interface side. A conductor plane on the cable termination side surrounds the cable receiving grooves and extends adjacent to each of the shield conductor grooves, the conductor plane includes a non-conductor region within the conductor plane adjacent to each of the conductor center conductor grooves. Multiple ground vias are associated with each of the cable receiving grooves spaced apart from and partially surrounding the center conductor via outside and adjacent to the non-conductor region, the ground vias extending through the printed circuit board from the cable termination side to the system interface side.

In some embodiments, a conductor plane is located on the system interface side. In this embodiment, the ground vias and the shield via connect to the conductor plane on the system interface side.

In some embodiments, the center conductor via and the shield vias are filled vias.

In some embodiments, the center conductor groove and the shield conductor groove are conductor lined. In some embodiments, the shield conductor groove extends from the edge of the printed circuit board and is axially aligned with the center conductor groove. The insulator groove is between the conductor lined center conductor groove and the conductor lined shield conductor groove and electrically isolates the conductor lined shield conductor groove and the conductor lined center conductor groove.

The shielded cable interface module may be embodied in a cable assembly, which may connect an electronics board to a DIB in automated test equipment.

In one implementation, a method is provided for constructing a shielded cable interface module. The method may include forming vias through a board from a conductive plane on a cable termination side of the board to a conductive plane on a system interface side of the board. The method further includes forming a non-conductor region around a center conductor via within the conductive plane on the cable termination side. Moreover, this method includes forming a shielded cable receiving channel on a shield cable termination side of the board including axially aligned center conductor and shield grooves, the shield groove extending from an edge of the board, the center conductor groove extending over the center conductor via, the shield groove extending over a shield via of the plurality of vias. In this method, a conductor material may be formed in the center conductor and in the shield grooves. A dielectric groove is formed between center conductor groove and the shield groove after forming the conductor material in the conductor and the shield grooves.

In some implementations, the method further includes, forming ground vias in a radial pattern partially surrounding the center conductor via along a periphery of the non-conducting region.

The vias may be formed by drilling through the board and filling the via holes.

BRIEF DESCRIPTION OF THE DRAWINGS

FIGS. 7A-2 to 7H-2 are front views showing a process flow of a partially fabricated shielded cable interface module.

FIGS. 7A-1 to 7H-1 are cross sectional side views of FIGS. 7A-2 TO 7H-2, respectively, showing a process flow of partially fabricated shielded cable interface module.

DESCRIPTION

Figure 1:
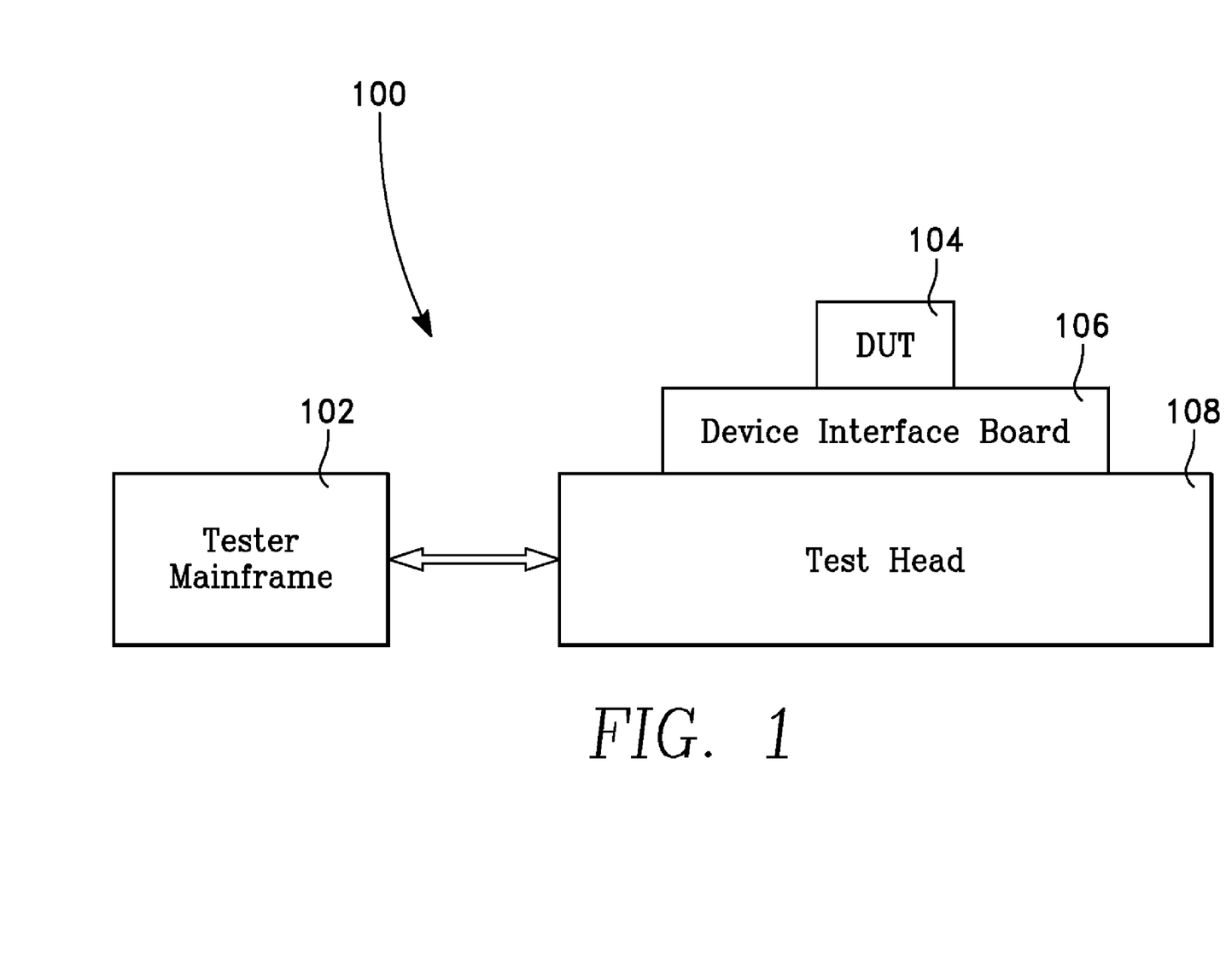
FIG. 1 is a simplified block diagram of an automatic test equipment system.
Figure 4A:
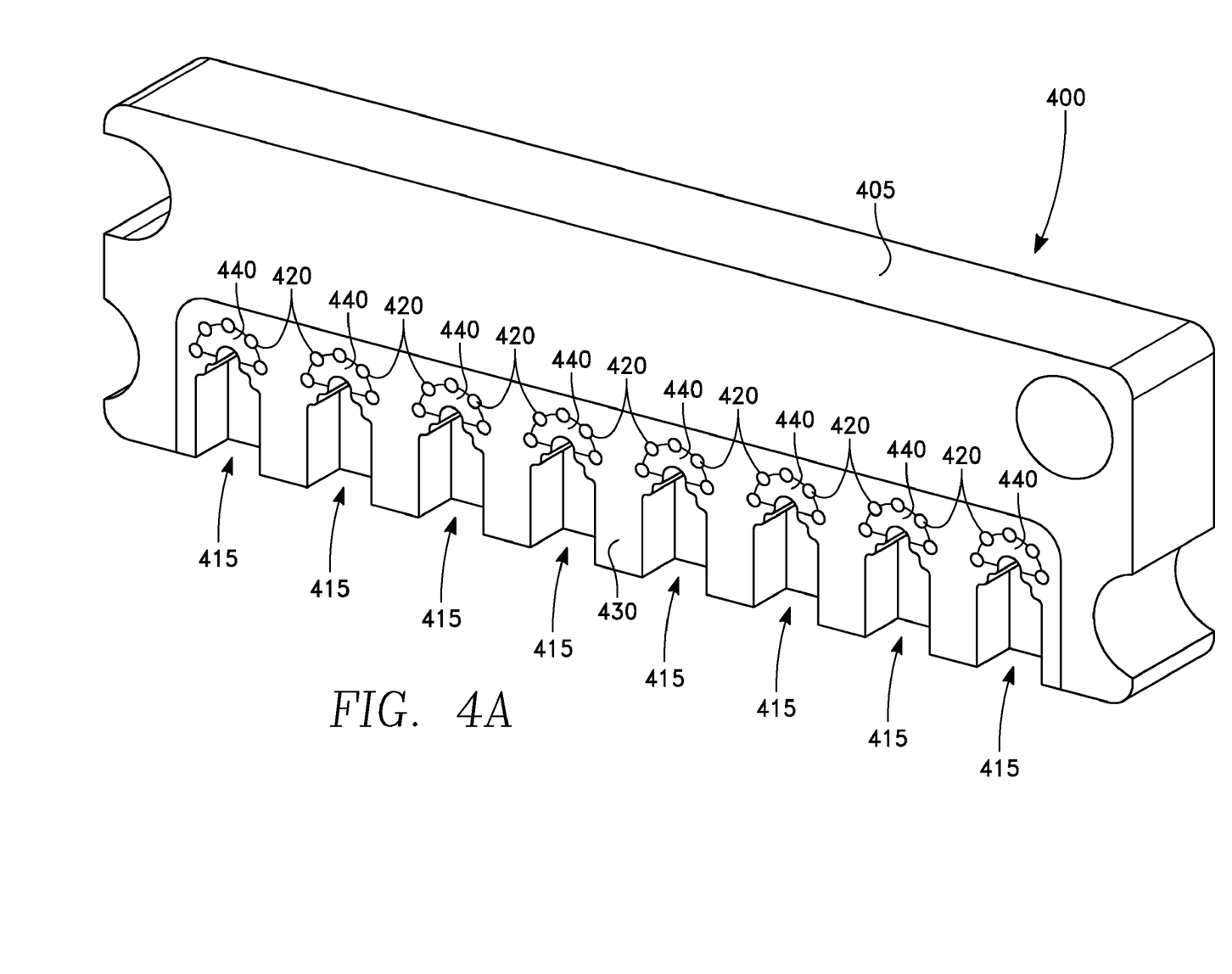
FIG. 4A is a front perspective view of an embodiment of a shielded cable interface module.
Figure 4B:
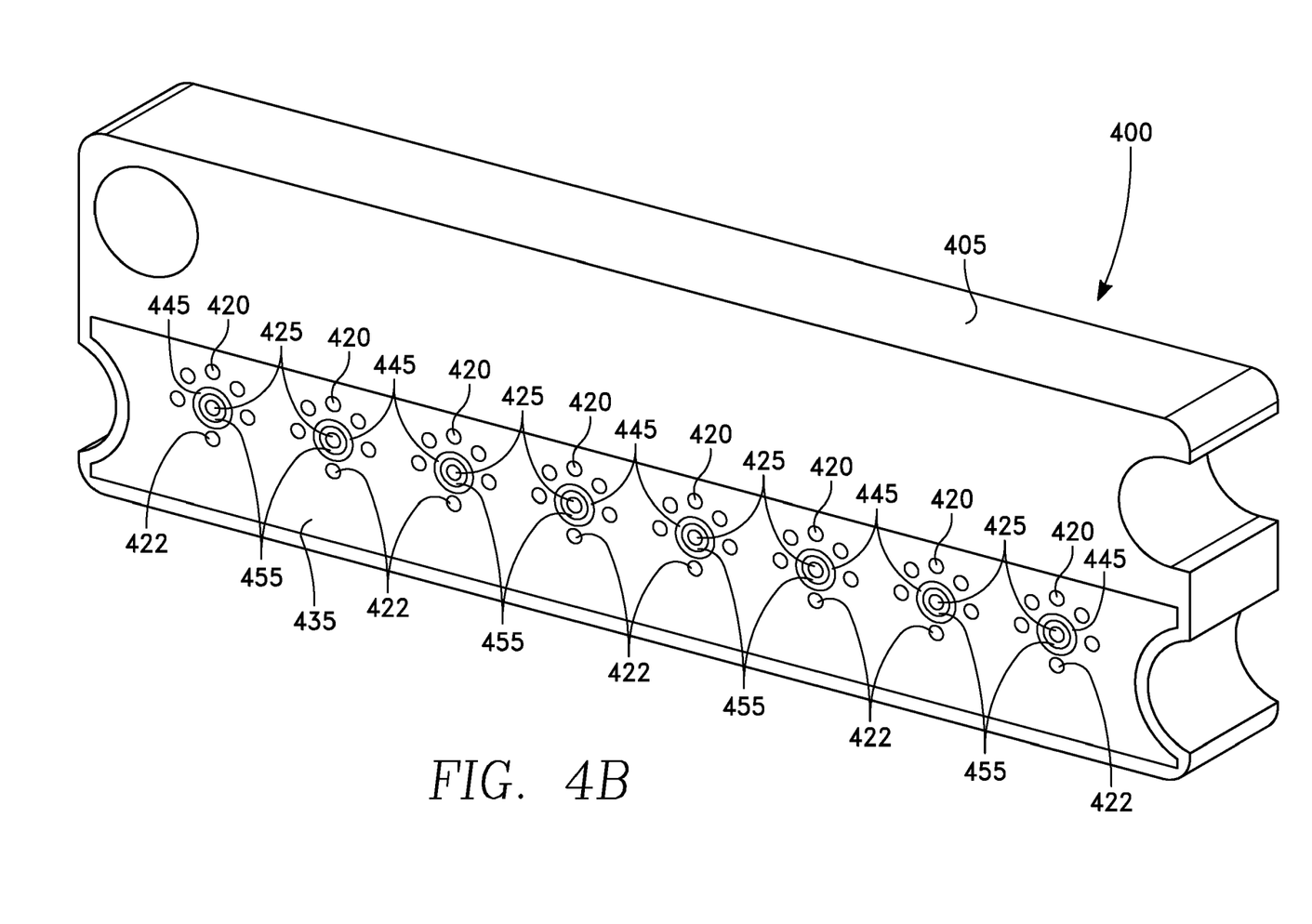
FIG. 4B is a back perspective view of an embodiment of a shielded cable interface module.

FIG. 1 shows a block diagram of one embodiment of a tester 100, which may include a shielded cable interface module 400 (shown in FIGS. 4A and 4B). The tester 100 includes a tester mainframe 102 that is in communication with a test head 108. The test head 108 is connected to a interface board 106. Signals from the test head 108 may be routed to the interface board 106 through cable assemblies employing various embodiments of the shielded cable interface module described hereinafter. In the embodiment shown, the interface board 106 is a device interface board or DIB. In operation, the device interface board 106 is electrically connected to a device under test (DUT) 104 for testing the DUT 104. The tester 100 may be an automated test equipment (ATE) system for testing integrated circuits, and the DUT 104 may be a semiconductor device including an integrated circuit, for example. Thus, signals from the test head 108 may be routed to the device interface board 106 through the shielded cable interface module, described hereinafter.

The tester mainframe 102 includes circuitry for generating test stimulus signals that are transferred through the test head 108 and the DIB 106 to the DUT 104 and evaluating test response signals received from the DUT 104 through the DIB 106 and the test head 108. The DUT 104 may be a packaged silicon die including an integrated circuit to be tested. In another embodiment, the interface board 106 is a probe interface board, and the DUT 104 may be a semiconductor wafer including an integrated circuit to be tested.

Figure 2:
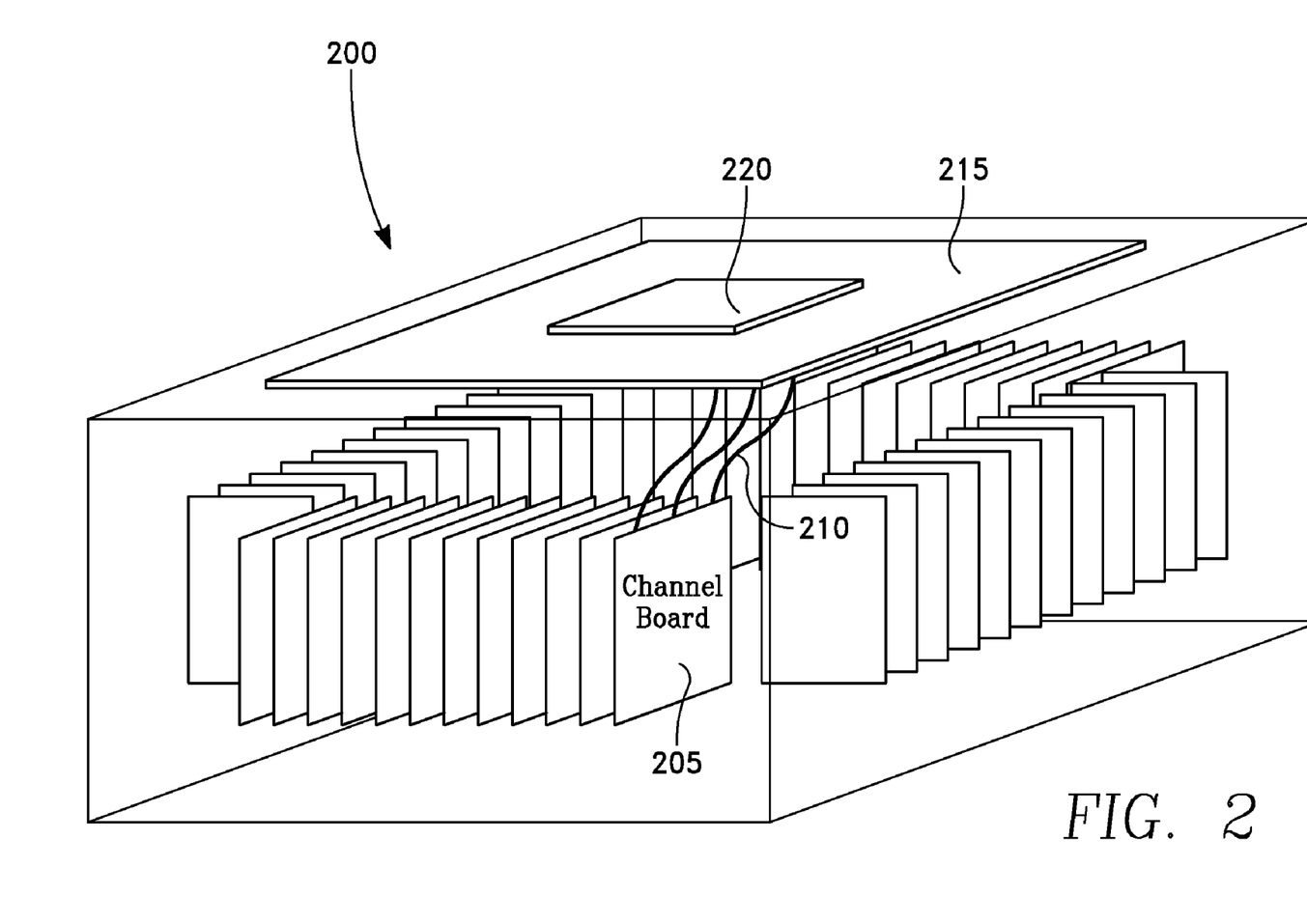
FIG. 2 is a simplified illustration in perspective view of a test head of automatic test equipment.

In FIG. 2, an embodiment of a test head 200 has a number of channel boards or instrumentation boards 205 connected through a number of coaxial cables 210 to the device interface board (DIB) 215. The DIB 215 provides the necessary signals from the coaxial cables 210 to a device-under-test (DUT) 220. Performance and miniaturization of transistors have resulted in a number of coaxial cables 210 challenges to provide signal paths from low cable density channel boards 205 to a high signal density interface of the DIB 215. In the prior art the connection interface between the channel boards 205 and the coaxial cables 210 are mechanical connectors such as the SMA as described above. This type of connection system is complicated, requires skilled technical assembly, and is expensive. In an embodiment, the coaxial cable 210 connection between the channel board 205 and the DIB 215 is shown in FIG. 3.

Figure 3:
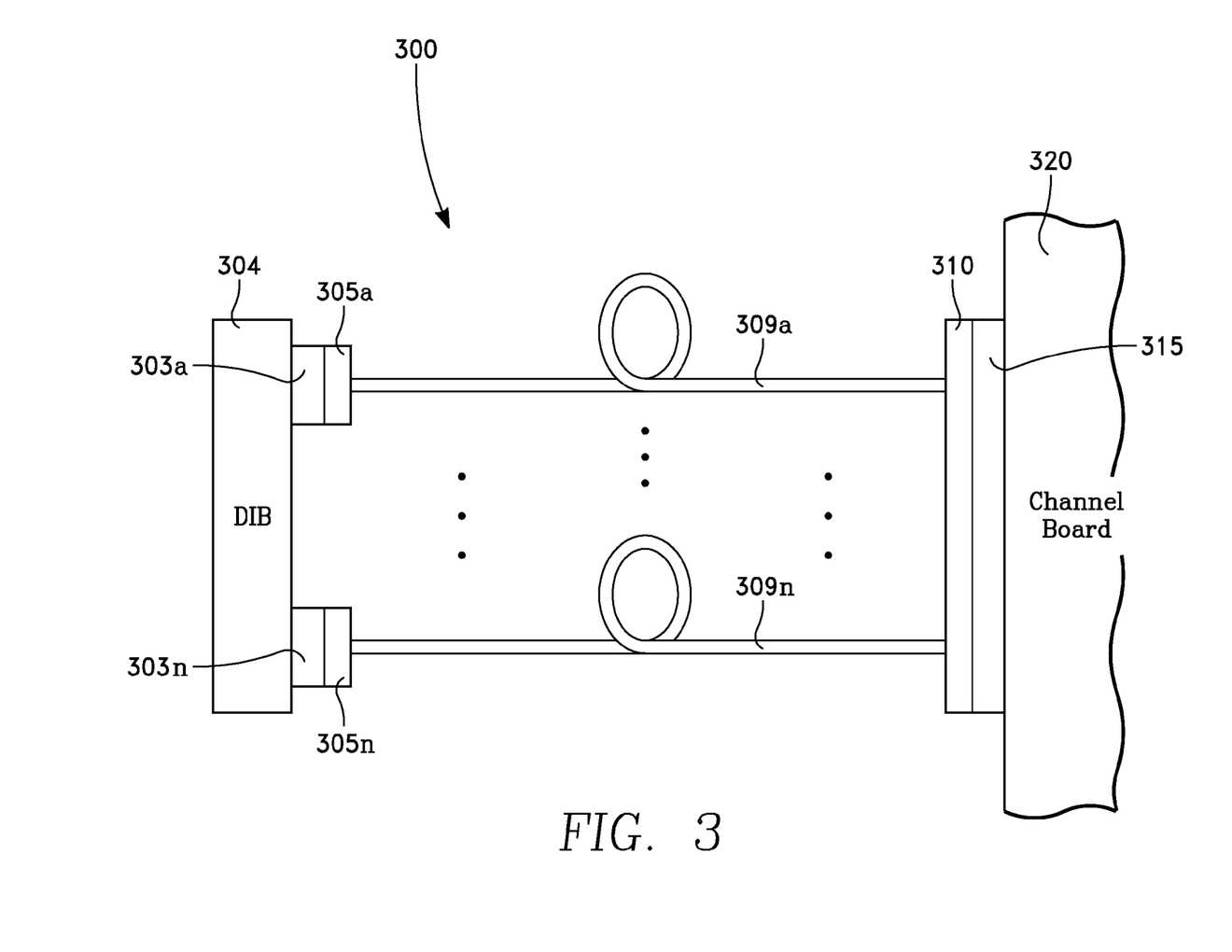
FIG. 3 is a simplified side view diagram illustrating a cable assembly within a test head of automatic test equipment employing an embodiment of a shielded cable interface module.

Referring to FIG. 3, a possible embodiment of a cable assembly 300 includes at least one coaxial cable 309a, ..., 309n connected to at one end to a high cable density electronics channel board 320. The opposite end of the coaxial cables 309a, ..., 309n is coupled to a higher signal density device interface board 304 with a coaxial cable to printed circuit board interface module 305a, ..., 305n. An interface side of the device interface board 304 contacts an interposer 303a, ..., 303n. The interposer 303a, ..., 303n is preferably a compliant interposer, which contacts the tester interface board 304. The interface board 304 may contact one or more devices under test (not shown). Thus, signals from many electronics channel boards 320 may be routed to a single interface board 304.

A shielded cable interface module 310 provides right angle connections for the coaxial cables 309a, ..., 309n to the channel board 320. A second interposer 315 is used in some embodiments to provide the electrical contacts between the shielded cable interface module 310 and the channel board 320. The details of various embodiments of the structure of the shielded cable interface module 310 are described hereinafter.

Turning to FIGS. 4A and 4B for a discussion of an embodiment the shielded cable interface module 400. FIG. 4A is a front perspective view of an embodiment of a shielded cable interface module 400. FIG. 4B is a back perspective view of an embodiment of a shielded cable interface module 400. In this embodiment, the cable interface module 400 is shown elongated and substantially flat, generally in the shape of a paddle to facilitate cable mounting along a long edge of the cable interface module 400.

The shielded cable interface module 400 is formed of a printed circuit board 405 that is fabricated with a conductor planes 430 and 435, formed of a conductor such as copper, on its front side or shielded cable termination side (FIG. 4A) and on its back side or system interface side (FIG. 4B), respectively. (Although conductor planes 430 and 435 may also be referred to herein as ground planes, the conductor or ground planes 430 and 435 may serve as return or shield conductors in their function.)

The shielded cable interface module 400 is drilled and filled to form ground vias 420, shield vias 422, and center conductor vias 425. (Although referred to as ground vias 420 for discussion purposes, the vias 420 may serve as return vias or shield vias in their function.) The via holes are filled with a conductive material such as by plating with copper, filling with metal epoxy, or other known technique.

The locations and the spacings of the ground vias 420 with respect to the center contact vias 425 in the dielectric board 405 are determined according to the desired impedance. The configuration and spacings of the ground vias 420 with respect to the center contact vias 425 may be determined through calculations, empirical means, or by computer simulation.

The front side of the shielded cable interface module 400 has a plurality of laterally extending coaxial cable receiving grooves 415 such that each coaxial cable termination channel receives a coaxial cable (not shown). In some embodiments, the center conductor of each coaxial cable is placed in a narrower plated groove section of each of the grooves 415 that is in contact with the center contact via 425 associated with each groove 415. A larger groove section is formed in each of the plated grooves 415 to receive the shield of the coaxial cable. The shield of the coaxial cable is bonded to the plated area of the larger groove section of the grooves 415. An intermediary groove section is formed between the larger groove section and the smaller groove section of the grooves 415 to disconnect the plated section of the lager groove section from the smaller groove section.

The front side conductor plane 430 is connected to the back side conductor plane 435 by ground vias 420. A non-conductor section 440 within the front side conductor plane 430, such as by removing conductor material from the conductor plane 430, to insure that the center conductor of the coaxial cable does not touch the conductor plane 430. In the embodiment of FIG. 4A, the non-conductor section 440 is partially bounded by the ground vias 420. In this embodiment the ground vias 420 form a spaced semi-circular pattern around the center conductor via 425 and the non-conductor section 440 is a semi-circular section within the conductor plane 430. The ground vias 420 are connected with the conductor plane 430.

Referring to FIG. 4B, a center conductor via isolation region 445 is formed by removing a portion of the back side conductor plane 435 to define a center conductor via pad 455 and electrically isolate the center conductor via 425 and within the conductor plane 435. The isolation region 445 is bounded by the ground vias 420. The ground vias 420 are connected with the conductor plane 435 to provide shielding for the center conductor via 425.

Figure 5A:
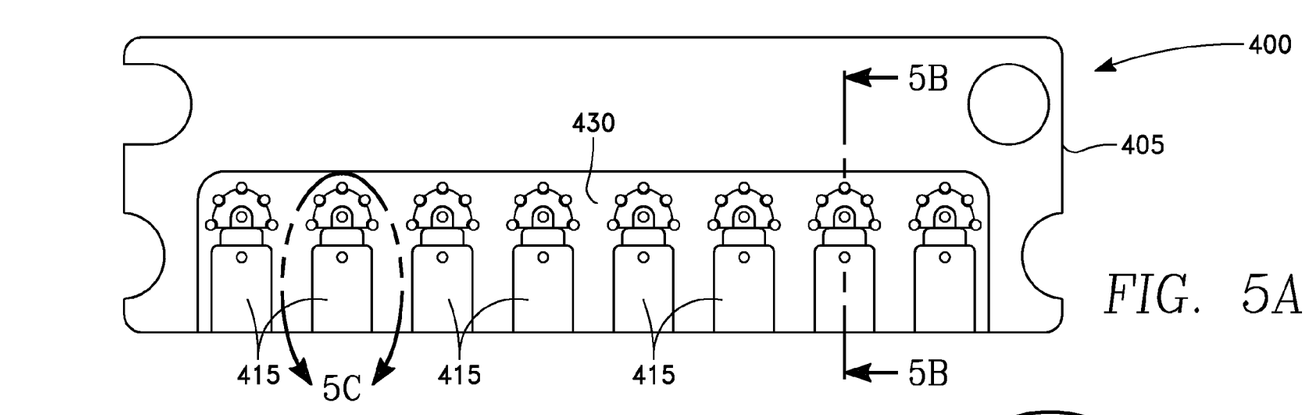
FIG. 5A is a front view of an embodiment of a shielded cable interface module of FIG. 4A.

FIG. 5A is a front view of an embodiment of a shielded cable interface module 400 of FIG. 4A. Laterally extending cable receiving channels 415 are formed within the ground plane 430 to receive coaxial cables (not shown) to create a cable assembly (not shown). Thus, the ground plane 430 surrounds the cable receiving channels 415 to the edge of the printed circuit board 405. FIG. 5A as shown illustrates eight laterally extending cable receiving channels 415. The shielded cable interface module 400, however, can be fabricated with any number of laterally extended cable receiving channels 415 to receive one or more coaxial cables.

Figure 5B:
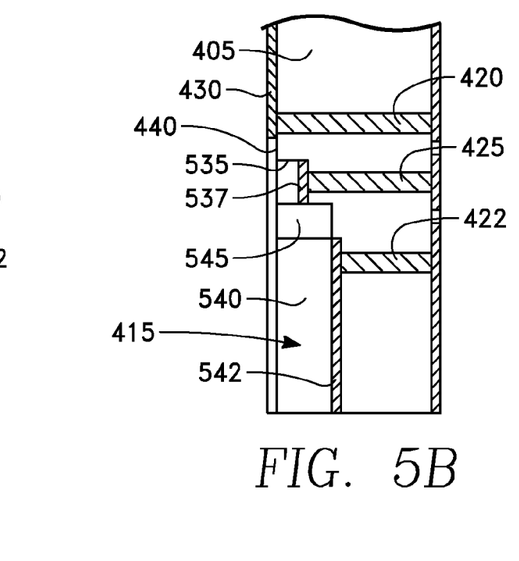
FIG. 5B is cross sectional side view of the embodiment of the shielded cable interface module along the 5B-5B line of FIG. 5A.
Figure 5C:
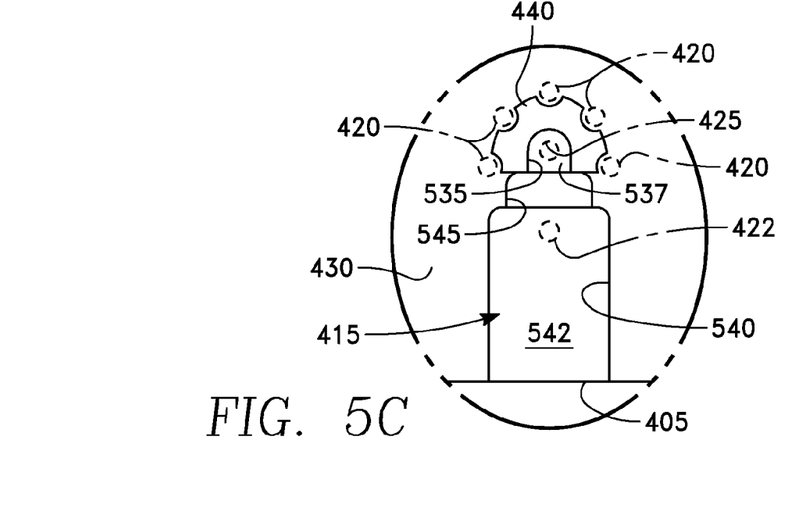
FIG. 5C is an enlarged cut away section of the front view of the embodiment of the shielded cable interface module along the 5C line of FIG. 5A.

Refer now to FIGS. 5B and 5C, FIG. 5B is a cross sectional side view of the embodiment of the shielded cable interface module 400 along the 5B-5B line of FIG. 5A. FIG. 5C is an enlarged cut away section of the front view of the embodiment of the shielded cable interface module 400 along the 5C line of FIG. 5A. As discussed above, the printed circuit board 405 has multiple ground vias 420 spaced apart and partially surround the center conductor via 425. The multiple ground vias 420, the shield via 422, and the center conductor via 425 are formed by drilling via holes into the printed circuit board 405 and plating and filling the holes with a conductive material. This filling may be with conductive metal filled epoxy or by plating the vias with a metal such as copper.

A portion of the ground plane 430 is removed by a process such as etching to form a non-conductor region 440 that isolates the center conductor via 425 from the ground plane 430. The cable receiving channels 415 have a center conductor groove 535, a shield conductor groove 540, with a dielectric insulator groove 545 therebetween.

In one implementation, the center conductor groove 535 is formed in the printed circuit board 405 by milling, routing, drilling, or other similar machine cutting process. The center conductor groove 535 is oriented such that center conductor via 425 and the shield via 422 lay essentially on a center axis of the center conductor groove 535. The shield conductor groove 540 is formed in the printed circuit card 405 by milling, routing or other similar machine cutting process. The shield conductor groove 540 is oriented axially with the center conductor groove 535 so that the shield via 422 is essentially along a central axis of the shield conductor groove 540.

In some implementations, a conductive material 537 and 542 is deposited in the center conductor groove 535 and the shield conductor groove 540, respectively. For example, the center conductor groove 535 and the shield conductor groove 540 may be plated 537 and 542 with copper. Thereafter, a portion of the printed circuit board 405 along with the conductive material thereon is removed, such as by milling, etc., in the area of the juncture of the plated center conductor groove 535 and the plated shield conductor groove 540 to form the dielectric insulator groove 545. The dielectric insulator groove 545 has a larger diameter than the center conductor groove 535 and is located axially with the center conductor groove 535 and shield conductor groove 540. The dielectric insulator groove 545 forms an insulative region that receives the dielectric insulator core of the coaxial cable and separates the plating 537 of the center conductor groove 535 from the plating 542 of the shield conductor groove 540.

An outer protective jacket of the coaxial cable (not shown in FIGS. 5A-5C) is removed for approximately the length of the center conductor groove plus dielectric groove plus shield groove 535, 545 and 540, respectively. The dielectric insulator core is then exposed for approximately the length of the dielectric insulator groove 545 and the metallic shield is exposed for approximately the length of the shield conductor groove 540. A small amount of solder or solder paste is placed in the center conductor groove 535 and in the shield conductor groove 540 and the center conductor of the coaxial cable is bonded to the plating 537 of the center conductor groove 535. The metallic shield of the coaxial cable is bonded to the plating 542 of the shield conductor groove 540.

Figure 6A:
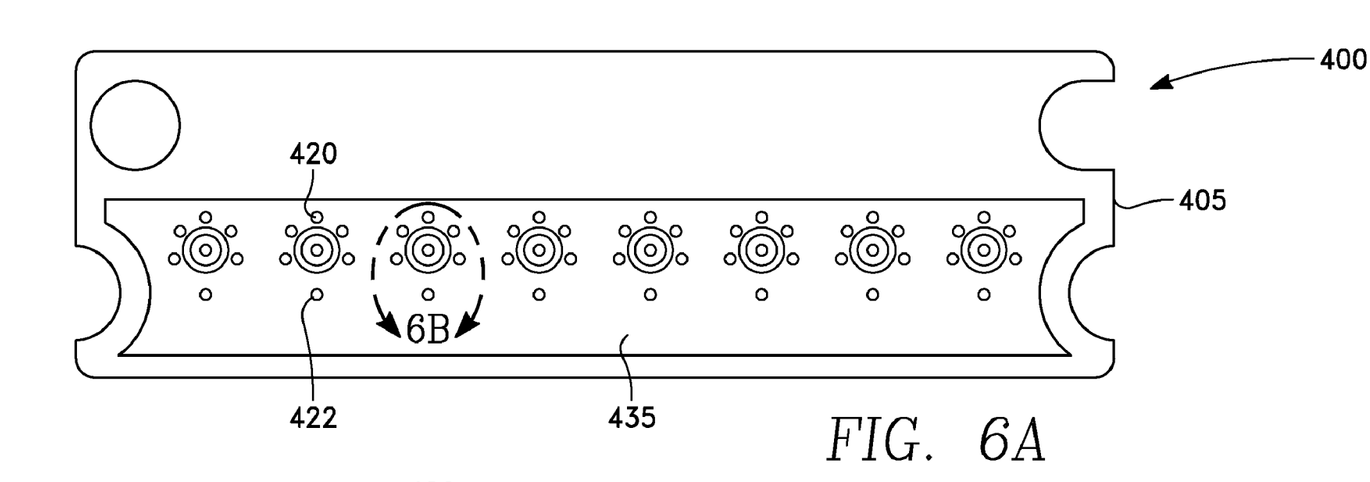
FIG. 6A is a back side view of an embodiment of a shielded cable interface module of FIG. 4B.

FIG. 6A is a back side view of an embodiment of a shielded cable interface module of FIG. 4B. The back side of the printed circuit board 405 is used to provide the interface connections between the cable assembly and a system board, such as the channel board 205 (shown in FIG. 2) of an automatic test equipment system 100 (shown in FIG. 1). The structure shown in FIG. 6A may be used with a compliant pressure connection, such as an interposer 315 (shown in FIG. 3). The printed circuit board 405 has a ground plane 435 that is connected to the multiple ground vias 420 and the shield via 422.

Figure 6B:
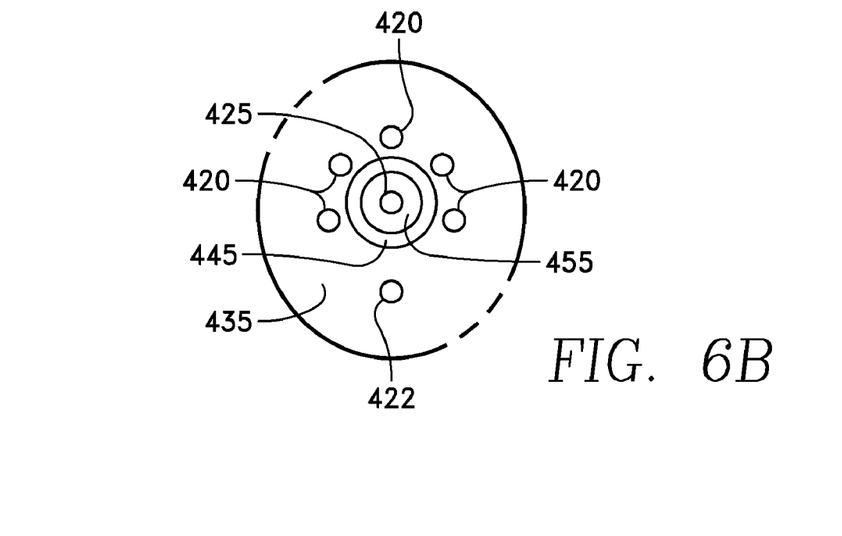
FIG. 6B is an enlarged cut away section of the back side view of the embodiment of the shielded cable interface module along the 6B line of FIG. 6A.

FIG. 6B is an enlarged cut away section of the back side view of the embodiment of the shielded cable interface module along the 6B line of FIG. 6A. In FIG. 6B, a portion of the ground plane 435 is removed to form the center conductor isolation region 445 forming the center conductor via pad 455 to electrically isolate the center conductor via 425 from the ground plane 435.

The dimensional and material properties are chosen such that the impedance of the coaxial cable is nearly matched through the shielded cable interface module 400 and the interposer to the channel board. These dimensions and materials are determined by calculation, by empirical means, or by computer simulation.

Figure 7A:
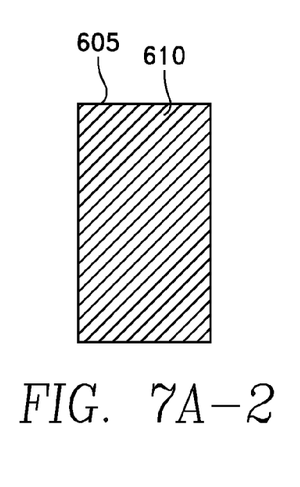
Figure 7A:
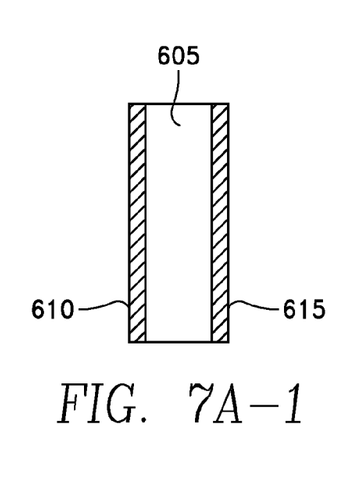
Figure 7B:
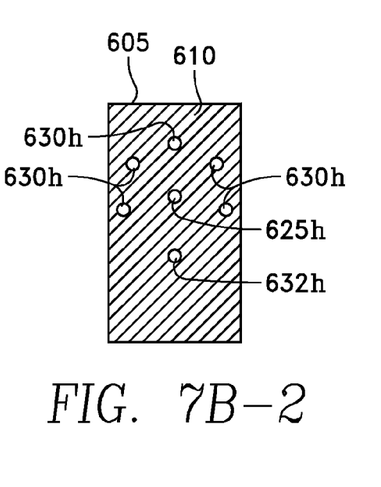
Figure 7B:
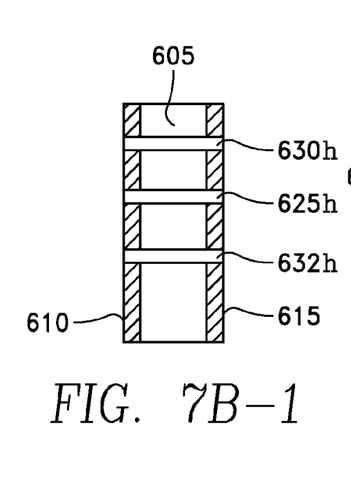
Figure 7C:
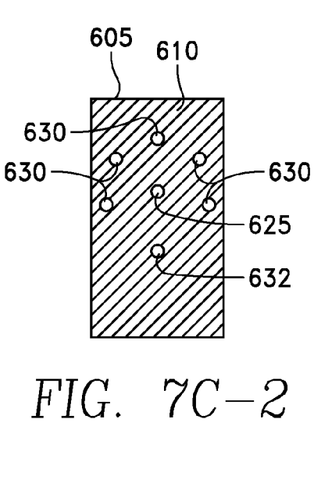
Figure 7C:
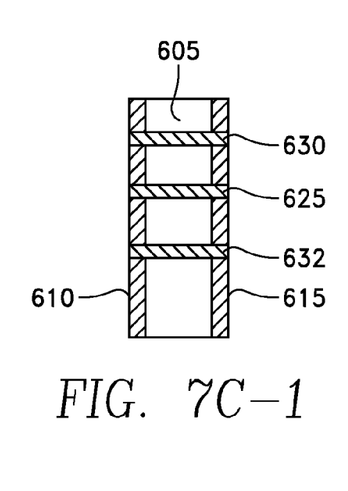

Refer now to FIGS. 7A-1 to 7H-2 for a discussion of one possible implementation of the method for fabricating a shielded cable interface module. FIGS. 7A-2 to 7H-2 are front views showing a process flow of a partially fabricated shielded cable interface module. FIGS. 7A-1 to 7H-1 are cross sectional side views of FIGS. 7A-2 TO 7H-2, respectively, showing a process flow of partially fabricated shielded cable interface module.

Shown in FIGS. 7A-1 and 7A-2, in one implementation, a printed circuit board is constructed with center insulative material 605 is coated on opposite sides (a cable termination side and a system interface side) with external layers of conductive material 610 and 615 deposited or adhered to the printed circuit board 605. As shown in FIGS. 7B-1 and 7B-2, the printed circuit board is drilled to provide a center conductor via hole 625h, surrounding ground via holes 630h, and shield via holes 632h. The center conductor via hole 625h, ground via holes 630h, and shield via hole 632h are plated and filled with a conductive material, such as by plating or filling with a conductive paste, to form the center conductor via 625, ground vias 630, and shield via 632. The center conductor via 625, ground vias 630, and shield via 632 configured to provide a desired characteristic impedance, i.e. 50 ohm, 75 ohm, 100 ohm, or other value, through the shielded cable interface module 600. In the embodiment, shown ground vias 630 are arranged so that they are spaced apart and partially surround the center conductor via 625, with the shield via 632 in being located to connect to the shield of an inserted coaxial cable (not show).

Figure 7D:
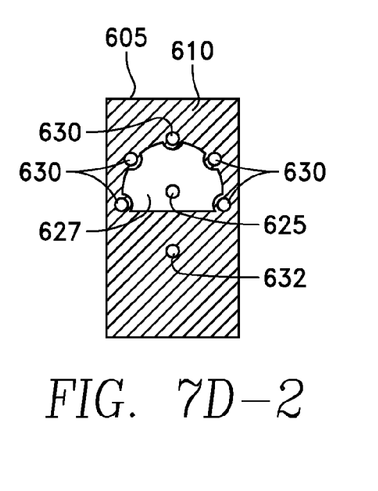
Figure 7D:
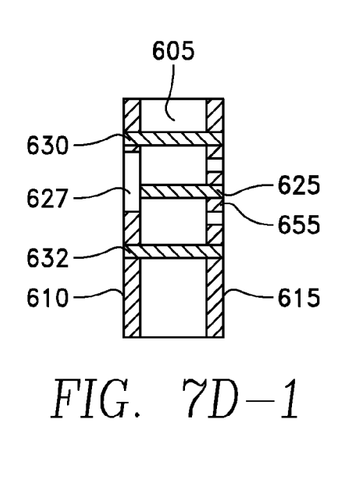

Shown in FIGS. 7D-1 and 7D-2, the conductive material 610 on a cable termination side of the printed circuit board is etched to create a non-conductor region 627 electrically isolating the center conductor via 625 from the conductive material 610 and the ground vias 630. The conductive material 615 on the system interface side is etched to isolate the center conductor via 625 from the conductive material 615, and which may also define an optional center conductor pad 655, as shown. The center conductor pad 655 is electrically connected to the center conductor of the coaxial cable (not shown) through the center conductor via 625 at the interface side of the printed circuit board 615.

Figure 7E:
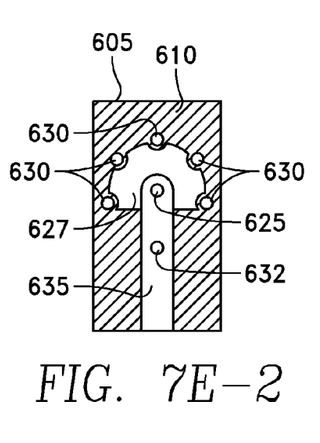
Figure 7E:
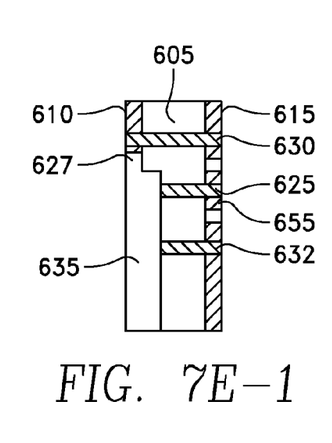
Figure 7F:
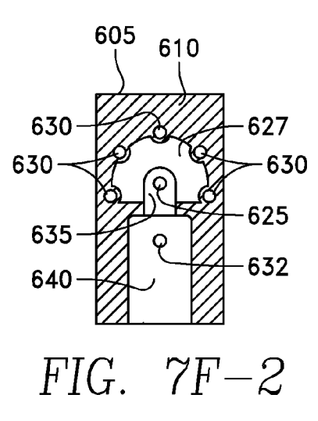
Figure 7F:
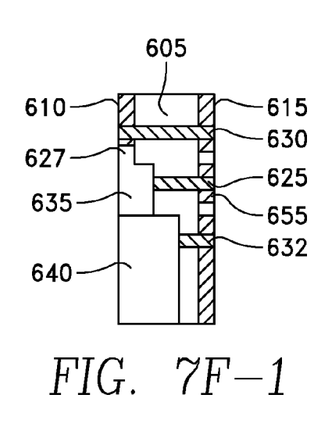
Figure 7G:
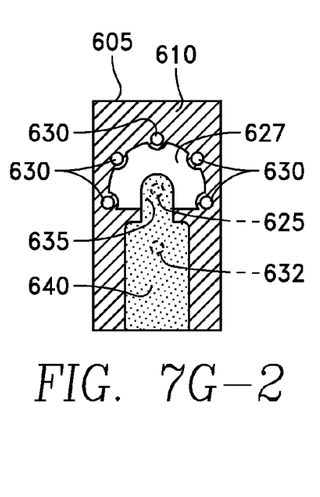
Figure 7G:
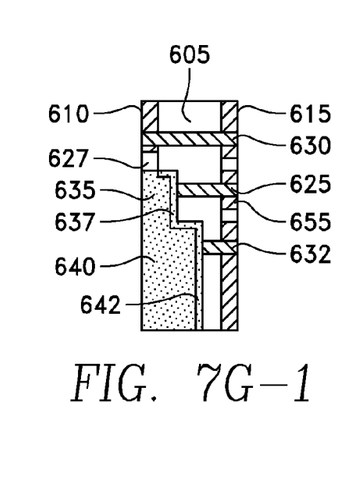

Shown in FIGS. 7E-1 and 7E-2, a center conductor groove 635 is formed in cable termination side by removing a portion of the conductive material 610 and a portion of the insulative material 605, along with a portion of the center conductor via 625 and a portion of the shield via 632. The center conductor groove 635 is formed above a remaining portion of the center conductor via 625.

Shown in FIGS. 7F-1 and 7F-2, a shorter, deeper and wider shield groove 640 is formed coaxial with the center conductor groove by removing a second portion of the conductive material 610, a second portion of the insulative material 605, and a second portion of the shield via 632. The shield groove 640 is created above a remaining portion of the shield conductor via 632. As shown in FIGS. 7G-1 and 7G-2, the center conductor groove 635 and the shield conductor groove 640 may be plated 637 and 642, respectively.

Figure 7H:
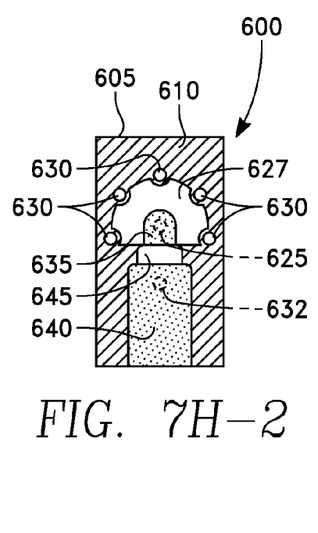
Figure 7H:
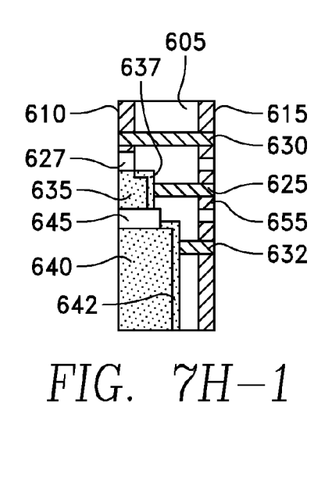

Shown in FIGS. 7H-1 and 7H-2, a portion of the plating 637 in the center conductor groove 635 is removed along with a third portion of the conductive layer 610, a third portion of the insulative material 605. This electrically isolates the plated center conductor groove 635 from the plated shield conductor groove 640 and from the conductive material 610. A coaxial cable (not shown) is inserted into the shielded cable interface module 600. The center conductor of the coaxial cable (not shown) is electrically bonded to the plated center conductor groove 635 and the shield of the coaxial cable (not shown) is electrically bonded to the plated shield conductor groove 640.

Figure 8A:
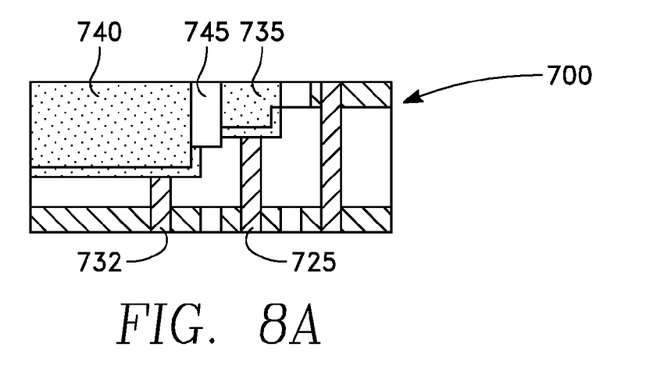
FIG. 8A shows a cut away side view of shielded cable interface module prior to solder and shielded cable insertion.
Figure 8B:
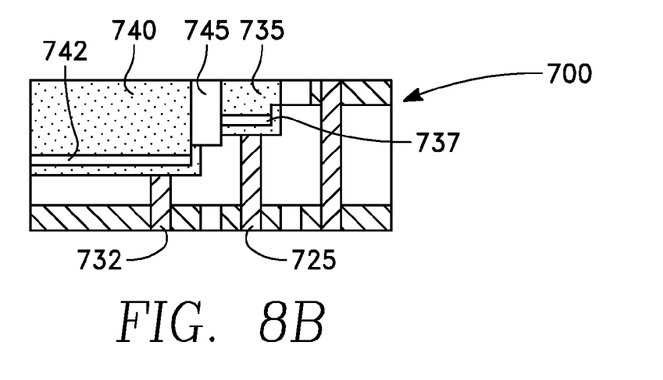
FIGS. 8B and 8C show cut away side views of partial fabrication of an embodiment with the shielded cable bonded directly to the shielded cable interface module.
Figure 8C:
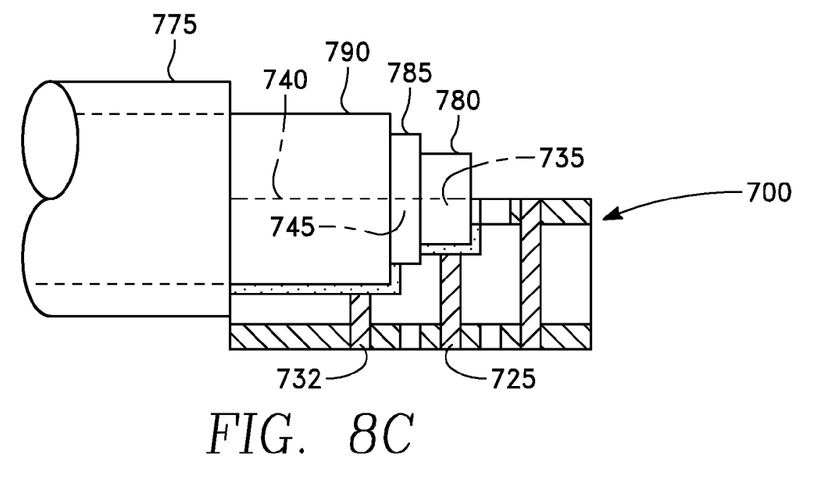

Refer now to FIGS. 8A to 8C for a discussion of an implementation for assembly of one embodiment of a cable assembly incorporating the shielded cable interface module 700. FIG. 8A, shows a shielded cable interface module prior to solder and coaxial cable insertion. FIGS. 8B and 8C illustrate one implementation where the coaxial cable 775 is bonded directly to the shielded cable interface module 700.

Referring to FIG. 8A, a shielded cable interface module 700 is constructed as described above to have a shield conductor groove 740, a dielectric insulator groove 745, and a center conductor groove 735. The shield conductor groove 740 is constructed to be in contact with the shield via 732. The center conductor groove 735 is constructed to be in contact with the center conductor via 725. The center conductor groove 735 is isolated from the shield conductor groove 740 by the dielectric insulator groove 745.

Referring to FIGS. 8B and 8C, for assembly, a solder plug or solder paste 742 is placed in the shield conductor groove 740 and a solder plug or solder paste 737 is placed in the center conductor groove 735. The coaxial cable is placed such the shield 790 is fitted to the shield conductor groove 740, the dielectric insulator core 785 is in the dielectric insulator groove 745 and the center conductor 780 is placed in the center conductor groove 735. The solder is heated by techniques such as a hot bar (knife) or thermode contact to the shield via 732 and the center contact via 725 or a hot gun provides heat to the shield via 732 and the center contact via 725 to melt the solder plugs 737 and 742. Alternately, the whole assembly may be heated in an oven to a temperature to melt the solder plugs 737 and 742. In other embodiments, other forms and methods of soldering are possible, such as for example conductive epoxy. In some embodiments, this secures the cable with a joint that is very strong and which allows a joint that does not require additional securing means. It is further possible in some embodiments, however, to use epoxy or potting material, or a mechanical retainer on top of the shield to further secure the joint, if desired.

Upon completion of the attachment of the coaxial cable(s) 775 to the shielded cable interface module 700, the cable assembly 775 and 700 is placed in contact with an interposer at the system interface side of the shielded cable interface module 700 to mechanically make a compliant pressure connection to the channel board 205 of FIG. 2. The shielded cable interface module 700 is secured to the channel board 205, such as with screws and a back plate or a bolster plate (not shown). Other know means of connecting, may be used to secure the shielded cable interface module 700 with the channel board 205 are possible.

Although the term "coaxial cable" is used herein for example purposes, the term is merely illustrative and intended to include axial cables in general including concentric cables such as coaxial cable, triaxial cable, or other multiaxial cable, as well as twinaxial cable, and non-concentric cable, and impedance controlled cable in general, or any assortment thereof.

The printed circuit board or printed wire board may be fabricated with printed circuit board sequential lamination technology known in the art. Further, although referred to as a printed circuit board, the term is intended encompass any insulating board that allows via and groove formation. In addition, in various implementations, the conductor plane(s) may be formed/deposited prior to or after forming the via holes, and/or prior to or along with formation/deposition of the conductive material in the center conductor and shield grooves.

While this invention has been particularly shown and described with reference to the embodiments thereof, it will be understood by those skilled in the art that various changes in form and details may be made without departing from the spirit and scope of the invention.

What is claimed is:

1. A shielded cable interface module comprising a printed circuit board comprising a cable termination side and a system interface side, the cable interface module comprising:
   a) a plurality of cable receiving grooves in the cable termination side extending laterally to an edge of the printed circuit board, each of the plurality of cable receiving grooves comprising a center conductor groove, an insulator groove, and a shield conductor groove;
   b) a center conductor via extending through the printed circuit board from the center conductor groove to the system interface side;
   c) a shield via extending through the printed circuit board from the shield conductor groove to the system interface side;
   d) a conductor plane on the cable termination side surrounding the plurality of cable receiving grooves and extending adjacent to each of the plurality of shield conductor grooves, the conductor plane comprising a non-conductor region within the conductor plane adjacent to each of the center conductor grooves; and e) a plurality of ground vias associated with each of the plurality of cable receiving grooves spaced apart from and partially surrounding the center conductor via outside and adjacent to the non-conductor region, the plurality of ground vias extending through the printed circuit board from the cable termination side to the system interface side.

2. The cable interface module of claim 1 further comprising a conductor plane on the system interface side connected to the plurality of ground vias and the shield via.

3. The cable interface module of claim 2, wherein
a) the center conductor via is a filled center conductor via extending through the printed circuit board; and
b) the shield via is a filled shield via extending through the printed circuit board.

4. The cable interface module of claim 3, wherein:
a) the center conductor groove is a conductor lined center conductor groove;
b) the shield conductor groove is a conductor lined shield conductor groove extending from the edge of the printed circuit board axially with the center conductor groove; and
c) the insulator groove is between the conductor lined center conductor groove and the conductor lined shield conductor groove and electrically isolates the conductor lined shield conductor groove and the conductor lined center conductor groove.

5. The cable interface module of claim 1, wherein:
a) the center conductor groove is a conductor lined center conductor groove;
b) the shield conductor groove is a conductor lined shield conductor groove extending from the edge of the printed circuit board axially with the center conductor groove; and
c) the insulator groove is between the conductor lined center conductor groove and the conductor lined shield conductor groove and electrically isolates the conductor lined shield conductor groove and the conductor lined center conductor groove.

6. The cable interface module of claim 5 further comprising a conductor plane on the system interface side connected to the plurality of ground vias and the shield vias.

7. The cable interface module of claim 5, wherein the conductor plane of the cable termination side is electrically connected to the conductor lined shield conductor groove.

8. The cable interface module of claim 6 further comprising a plurality of center conductor pads within and electrically isolated from the conductor plane on the system interface side, each of the plurality of center conductor pads being electrically connected to a respective center conductor via.

9. A cable assembly comprising:
a) a shielded cable interface module comprising printed circuit board having a cable termination side and a system interface side, the cable interface module comprising:
  1) a plurality of cable receiving grooves in the cable termination side extending laterally to an edge of the module, each comprising a center conductor groove, an insulator groove, and a shield conductor groove;
  2) a center conductor via extending through the printed circuit board from the center conductor groove to the system interface side;
  3) a shield via extending through the printed circuit board from the shield conductor groove to the system interface side;
  4) a conductor plane on the cable termination side surrounding the plurality of cable receiving grooves and extending adjacent to each of the plurality of shield conductor grooves, the conductor plane comprising a non-conductor region adjacent to each of the center conductor grooves; and
  5) a plurality of ground vias associated with each of the plurality of cable receiving grooves spaced apart from and partially surrounding the center conductor via outside and adjacent to the non-conductor region, the plurality of ground vias extending through the printed circuit board from the cable termination side to the system interface side; and
b) a plurality of shielded cables within the plurality of cable receiving grooves, each of the plurality of shielded cables comprising a center conductor electrically connected to the center conductor via and a shield conductor electrically contacting the shield conductor groove.

10. The cable assembly of claim 9, wherein:
a) the center conductor groove is a conductor lined center conductor groove;
b) the center conductor groove is a conductor lined shield conductor groove extending from the edge of the printed circuit board axially with the center conductor groove;
c) the insulator groove is an insulator groove between the conductor lined center conductor groove and the conductor lined shield conductor groove electrically isolating the conductor lined shield conductor groove and the conductor lined center conductor groove;
d) the center conductor via is a filled center conductor via extending through the printed circuit board from the conductor lined center conductor groove in the cable termination side to the system interface side; and
e) the shield via is a filled shield via extending through the printed circuit board from the conductor lined shield groove to the system interface side.

11. The cable assembly of claim 10, wherein the center conductor is electrically bonded to the conductor lined center conductor groove and the shield conductor is electrically bonded to the conductor lined shield conductor groove.

12. The cable assembly of claim 10, wherein the conductor plane of the cable termination side is electrically connected to conductor material of the shield conductor groove.

13. The cable assembly of claim 9 further comprising:
a) a conductor plane on a surface of the cable termination side adjacent to the shield conductor grooves, the conductor plane comprising a non-conductor region within the conductor plane adjacent to each of the center conductor grooves; and
b) a plurality of filled ground vias associated with each of the plurality of cable receiving grooves, the plurality of filled ground vias being outside and adjacent to at least a portion of the periphery of the non-conductor region, the plurality of ground vias extending through the printed circuit board from the conductor plane to the system interface side.

14. The cable assembly of claim 9 further comprising a conductor plane on the system interface side connected to the plurality of ground vias and the shield via.

15. The cable assembly of claim 9, further comprising a plurality of center conductor pads on the system interface side of the printed circuit board, each of the plurality of center conductor pads being electrically connected to a respective center conductor of a shielded cable through the center conductor via.

16. An automated test equipment system comprising:
   a) a test head comprising an instrument board;
   b) a device interface board (DIB); and
   c) a cable assembly connecting the instrument board and the DIB, the cable assembly comprising a shielded cable interface module comprising a printed circuit board comprising a cable termination side and a system interface side, the cable interface module comprising:
      1) a plurality of cable receiving grooves in the cable termination side extending laterally to an edge of the printed circuit board, each comprising a center conductor groove, an insulator groove, and a shield conductor groove;
      2) a center conductor via extending through the printed circuit board from the center conductor groove to the system interface side;
      3) a shield via extending through the printed circuit board from the shield conductor groove to the system interface side;
      4) a conductor plane on the cable termination side surrounding the plurality of cable receiving grooves and extending adjacent to each of the plurality of shield conductor grooves, the conductor plane comprising a non-conductor region adjacent to each of the center conductor grooves; and
      5) a plurality of ground vias associated with each of the plurality of cable receiving grooves spaced apart from and partially surrounding the center conductor via outside and adjacent to the non-conductor region, the plurality of ground vias extending through the printed circuit board from the cable termination side to the system interface side; and
   b) a plurality of shielded cables within the plurality of cable receiving grooves, each of the plurality of shielded cables comprising a center conductor electrically connected to the center conductor via and a shield conductor electrically contacting the shield conductor groove.

17. The automated test equipment system of claim 16, further comprising a conductor plane on the system interface side connected to the plurality of ground vias and the shield via.

18. The automated test equipment system of claim 16, wherein the center conductor groove is a conductor lined center conductor groove and the center conductor is electrically bonded to the conductor lined center conductor groove, and wherein the shield conductor groove is a conductor lined shield conductor groove and the shield conductor is electrically bonded to the conductor lined shield conductor groove.

19. The automated test equipment system of claim 16, wherein the conductor plane of the cable termination side is electrically connected to the shield conductor groove.

20. The automated test equipment system of claim 16, wherein the shielded cable interface module further comprises: at least one center conductor pad fabricated from the conductive material of a cable termination side of the printed circuit board such that the at least one center conductor pad is electrically coupled to the center conductor of the shielded cable through the center conductor via at the system interface side of the printed circuit board.

21. A method for constructing a shielded cable interface module, the method comprising:

a) forming a plurality of vias through a board from a conductive plane on a cable termination side of the board to a conductive plane on a system interface side of the board;
   b) forming a non-conductor region at least partially around a center conductor via of the plurality of vias within the conductive plane on the cable termination side;
   c) forming a shielded cable receiving channel on the cable termination side of the board comprising coaxial center conductor and shield grooves extending from an edge of the board, the center conductor groove extending over the center conductor via, the shield groove extending over a shield via of the plurality of vias;
   d) forming a conductor material in the center conductor and the shield grooves;
   e) wherein forming the shielded cable receiving channel comprises forming a dielectric groove between the center conductor groove and the shield groove after forming the conductor material in the center conductor and the shield grooves.

22. The method of claim 21, wherein forming the plurality of vias comprises forming ground vias in a radial pattern partially surrounding the center conductor via along a periphery of the non-conductor region.

23. The method of claim 21, wherein forming the non-conductor region comprises electrically isolating the center conductor via from the conductive plane on the cable termination side of the board.

24. The method of claim 21, wherein forming the plurality of vias comprises drilling and filling via holes.

25. A method for constructing a shielded cable interface module, the method comprising:
   a) forming a conductive plane on a cable termination side of a board;
   b) forming a conductive plane on a system interface side of the board;
   c) forming a center conductor via through the board;
   d) forming a shield via through the board to the conductive plane on the system interface side;
   e) forming a plurality of ground vias spaced apart from and partially surrounding the center conductor via extending from the conductive plane on the cable termination side to the conductive plane on the system interface side;
   f) forming a center conductor groove into the board through the conductive plane on the cable termination side, the center conductor groove extending from an edge of the board and over the center conductor via;
   g) providing a non-conductor region in the conductive plane on the cable termination side at least partially surrounding an end of the center conductor groove;
   h) forming a shield groove into the board axial with the center conductor groove extending from an edge of the board and over the shield via;
   i) forming conductive material in the center conductor groove;
   j) forming conductive material in the shield groove; and
   k) forming a dielectric groove by removing a portion of the conductor plane on the cable termination side and a portion of the center conductor groove so as to electrically isolate the conductive material in the center conductor groove from the conductor material in the shield groove.

26. The method of claim 25, wherein forming conductive material in the center conductor groove and forming conductive material in the shield groove comprises plating the center conductor groove and the shield groove.

27. The method of claim 25, wherein forming the center conductor via, forming the shield via, and forming the plurality of ground vias comprises drilling and filling the center conductor via, the shield via, and the plurality of ground vias.

28. The method of claim 27, wherein forming the center conductor groove, the shield groove, and forming the dielectric groove comprises drilling.

29. The method of claim 25 further comprising electrically bonding a center conductor of a shielded cable to the conductive material of the center conductor groove and electrically bonding a shield of the shielded cable to the conductive material of the shield groove.

30. The method of claim 25 further comprising: fabricating a center conductor pad on the center conductor via from the conductive plane on the system interface side.

31. A method for constructing a shielded cable interface module, the method comprising:
  a) constructing a printed circuit board comprising a center insulative material, a plane of conductive material on a cable termination side, and a plane of conductive material on a system interface side; and
  b) providing a plurality of shielded cable terminations comprising:
    1) drilling the printed circuit board to provide a center conductor via hole, a shield via hole, and a plurality of ground via holes spaced apart from and at least partially surrounding the center conductor via hole;
    2) filling the center conductor via hole, the shield via hole and the plurality of ground via holes with a conductive material to form a center conductor via, a shield via, and a plurality of ground vias;
    3) removing a first portion of the conductive material on the cable termination side of the printed circuit board, a first portion of the insulative material, a portion of the center conductor via, and a first portion of the shield via to create a center conductor groove above a remaining portion of the center conductor via;
    4) removing a second portion of the conductive material of the cable termination side of the printed circuit board, a second portion of the insulative material, and a second portion of the shield via to create a shield conductor groove above a remaining portion of the shield via;
    5) plating the center conductor groove and the shield conductor groove; and
    6) removing a third portion of the cable termination side of the printed circuit board, a third portion of the insulative material, and a portion of the plating of the center conductor groove.

32. The method of claim 31, wherein removing the third portion of the cable termination side of the printed circuit board, the third portion of the insulative material, and the portion of the plating of the center conductor groove electrically isolates the plated shield conductor groove and the plated center conductor groove.

* * * * *

UNITED STATES PATENT AND TRADEMARK OFFICE
CERTIFICATE OF CORRECTION

PATENT NO. : 7,977,583 B2
APPLICATION NO. : 11/963704
DATED : July 12, 2011
INVENTOR(S) : Roya Yaghmai et al.

It is certified that error appears in the above-identified patent and that said Letters Patent is hereby corrected as shown below:

At column 9, Claim 9, line 57, "comprising" should read --comprising a--.

At column 10, Claim 10, line 26, "b) the center conductor groove" should read --b) the shield conductor groove--.

Signed and Sealed this
Twenty-third Day of August, 2011

David J. Kappos
*Director of the United States Patent and Trademark Office*